(12) United States Patent
Okada et al.

(10) Patent No.: US 6,751,276 B1
(45) Date of Patent: Jun. 15, 2004

(54) METHOD AND APPARATUS FOR DECODING A DIGITAL SIGNAL

(75) Inventors: Koji Okada, Kasugai (JP); Masao Iijima, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,435

(22) Filed: Mar. 27, 2000

(30) Foreign Application Priority Data

Oct. 28, 1999 (JP) .......................................... 11-306889

(51) Int. Cl.[7] ................................................ H04B 1/10
(52) U.S. Cl. ...................... 375/350; 375/263; 375/290
(58) Field of Search ................................ 375/262, 263, 375/264, 286, 287, 289, 290, 291, 293, 346, 348, 350; 360/55, 60, 40, 41, 43, 46, 53; 714/701, 707, 746, 758, 760, 771, 774, 794, 798

(56) References Cited

U.S. PATENT DOCUMENTS

| | | | |
|---|---|---|---|
| 4,885,646 A | * 12/1989 | Kanota et al. | 360/46 |
| 5,802,118 A | * 9/1998 | Bliss et al. | 375/350 |
| 5,844,741 A | * 12/1998 | Yamakawa et al. | 360/65 |
| 5,857,002 A | * 1/1999 | Melas | 375/290 |
| 5,961,658 A | * 10/1999 | Reed et al. | 714/746 |
| 5,986,831 A | * 11/1999 | Muto | 360/46 |
| 6,115,198 A | * 9/2000 | Reed et al. | 360/46 |
| 6,122,120 A | * 9/2000 | Shimoda | 360/46 |
| 6,160,673 A | * 12/2000 | Izumi et al. | 360/46 |
| 6,212,664 B1 | * 4/2001 | Feygin et al. | 714/796 |
| 6,373,407 B1 | * 4/2002 | Nishiya et al. | 341/59 |

FOREIGN PATENT DOCUMENTS

| | | |
|---|---|---|
| JP | 04248169 A | 9/1992 |
| JP | 5-307837 | 11/1993 |
| JP | 5-325425 | 12/1993 |
| JP | 7-220408 | 8/1995 |
| JP | 8-77712 | 3/1996 |
| JP | 8-147893 | 6/1996 |
| JP | 10-112130 | 4/1998 |

OTHER PUBLICATIONS

German Office Action dated Dec. 17, 2003.

* cited by examiner

*Primary Examiner*—Khai Tran
*Assistant Examiner*—Khanh Cong Tran
(74) *Attorney, Agent, or Firm*—Armstrong, Kratz, Quintos, Hanson & Brooks, LLP

(57) ABSTRACT

A method of decoding a digital signal includes processing the digital using a delay operation in accordance with a frequency characteristic of 1+D, where D is an output signal of the delay element. The processed digital signal is then converted to a three level conversion signal (0, positive, negative). The conversion signal is then processed in accordance with a frequency of 1/(1+D) to generate a decoded signal. The conversion signal is also checked to determine if there is a conversion error. If a conversion error is detected, propagation of the error is restricted, such that a correct decoded signal is provided.

30 Claims, 15 Drawing Sheets

| Input | | | | Output | | |
|---|---|---|---|---|---|---|
| X1 | X0 | Dy1 | Dy0 | y1 | y0 | err |
| 0 | 0 | 0 | 0 | 0 | 0 | 0 |
| 0 | 0 | 0 | 1 | 0 | 0 | 1 |
| 0 | 0 | 1 | 1 | 0 | 0 | 1 |
| 0 | 1 | 0 | 0 | 0 | 1 | 0 |
| 0 | 1 | 0 | 1 | 0 | 0 | 0 |
| 0 | 1 | 1 | 1 | 0 | 1 | 1 |
| 1 | 1 | 0 | 0 | 1 | 1 | 0 |
| 1 | 1 | 0 | 1 | 1 | 1 | 1 |
| 1 | 1 | 1 | 1 | 0 | 0 | 0 |

| X | Dy | y | Error |
|---|----|---|-------|
| 0 | 0 | 0 | O |
| 0 | 1 | 0 | × |
| 0 | -1 | 0 | × |
| 1 | 0 | 1 | O |
| 1 | 1 | 0 | O |
| 1 | -1 | 1 | × |
| -1 | 0 | -1 | O |
| -1 | 1 | -1 | × |
| -1 | -1 | 0 | O |

×: Error  O: Normal

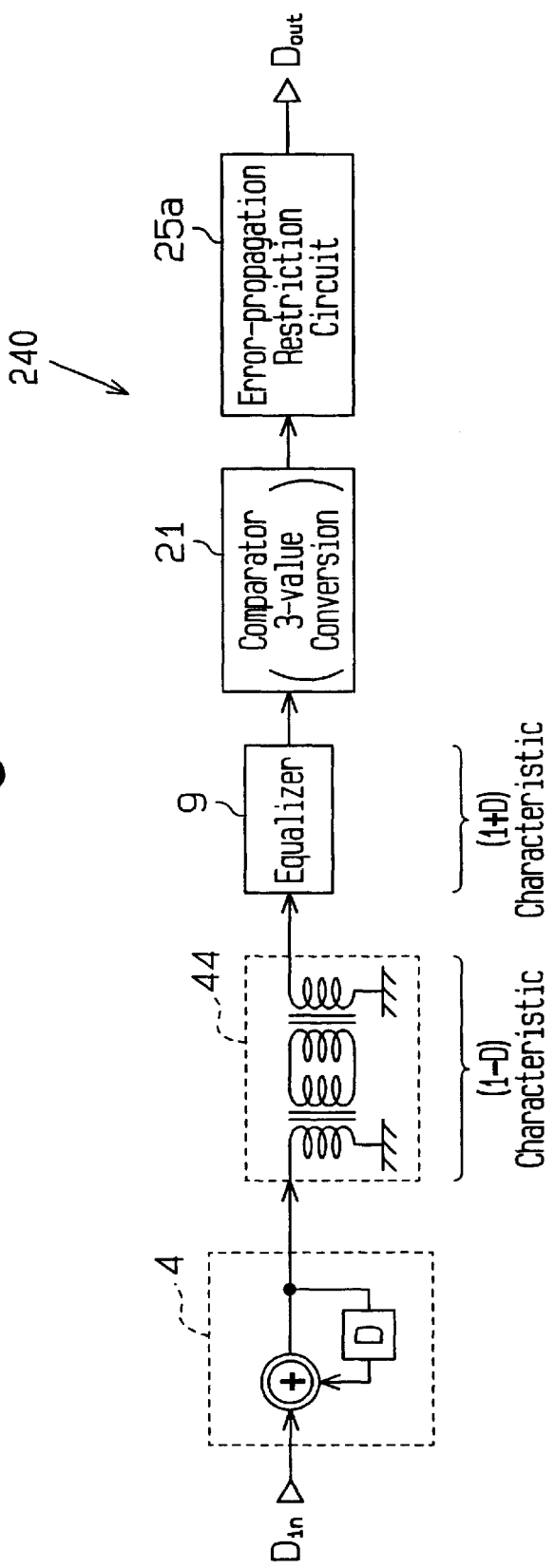

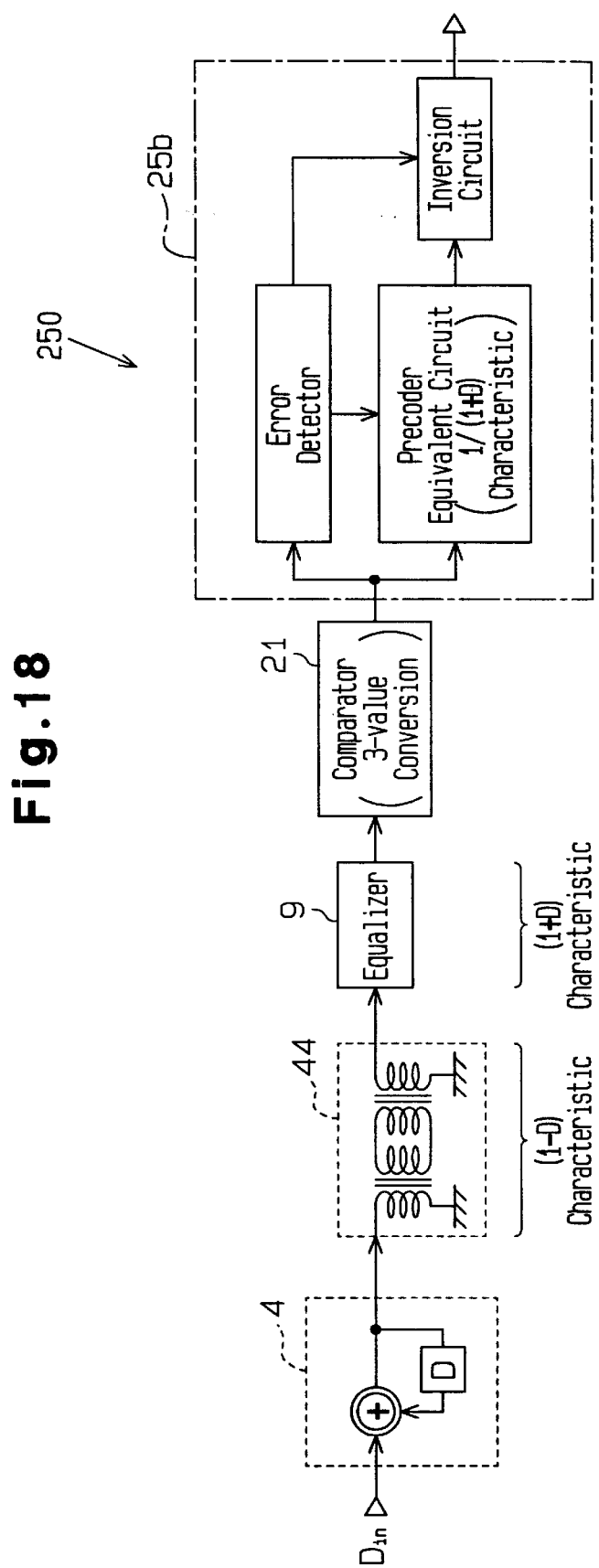

METHOD AND APPARATUS FOR DECODING A DIGITAL SIGNAL

BACKGROUND OF THE INVENTION

The present invention relates to a method and an apparatus for decoding a digital signal, and, more particularly, to a digital signal recording/reproducing apparatus which performs a decoding process on recorded digital signals and a digital signal transmission apparatus which performs a decoding process on transmitted digital signals.

A digital signal recording/reproducing apparatus uses a PR (Partial Response) class IV algorithm that performs NRZI code conversion in order to improve the recording density of magnetic recording media and improve the S/N ratio of decoded digital signals. Because a magnetic recording/reproducing system has a differential characteristic, recording and reproduction of data spreads the signal waveform, which causes an intersymbol interference. The PR system uses the intersymbol interference positively to shape a signal such that the power spectrum of a code is adequate for the transmission characteristic of a transmission line.

FIG. 1 is a schematic block diagram of a conventional digital signal recording/reproducing apparatus 100 which uses the PR class IV algorithm. A precoder 1 has a modulo-2 digital adder 2a and a 1-bit delay operation element 3a and has the characteristic of 1/(1+D). The precoder 1 receives, for example, a digital input signal Din as shown in FIG. 1, and performs a process of 1/(1+D) on the input signal Din to convert the input signal Din to an NRZI code S1 as shown in FIG. 2. The polarity of the NRZI code is inverted every time the input signal Din rises from "0" to "1". The polarity inversion means a transition of a signal value from "1" to "0" or from "0" to "1".

A write buffer 4 whose structure is similar to that of the precoder 1 has the characteristic of 1/(1−D). The write buffer 4 produces an output signal S2 by giving an intersymbol interference opposite to the one that is given by a recording/reproducing system to the NRZI code S1 from the precoder 1.

A recording/reproducing system 5 has a write head 6, a recording medium 7 and a read head 8. The output signal S2 of the write buffer 4 is written on the recording medium 7 via the write head 6 and the written signal is read from the recording medium 7 via the read head 8.

The writing operation to the recording medium 7 by the write head 6 has the differential characteristic of (1−D), and the operation of the read head 8 and an equalizer 9 has the differential characteristic of (1+D). Therefore, the recording/reproducing system 5 and the equalizer 9 carry out a process of {(1−D)(1+D)}, thereby accomplishing PR class IV impulse response.

The equalizer 9 performs PR equalization on an analog read signal generated by the read head 8, thereby producing an equalization signal S3. The equalization signal S3 is a multi-value signal as shown in FIG. 2.

A comparator 10 compares the equalization signal S3 from the equalizer 9 with threshold values A and B (shown in FIG. 2) and produces a decoded signal Dout of "0" or "1" which coincides with the input signal Din. When the level of the equalization signal S3 is higher than the threshold value A or is lower than the threshold value B, "1" is output otherwise "0" is output.

For digital signal recording/reproducing apparatuses which use recording media, such as a floppy disk, that needs swapping, however, the format of signals to be recorded on recording media is specified. Since the specifications states that the input signal Din is recorded on the recording medium using only a write buffer, the digital signal recording/reproducing apparatuses cannot use a precoder.

A digital signal recording/reproducing apparatus of a peak detection type which does not use a precoder cannot implement PR-system based recording and reproduction operations using a precoder. As a solution to this shortcoming, Japanese Unexamined Patent Publication Nos. 5-325425, 5-307837, 8-147893 and 8-77712 disclose apparatuses capable of adapting the PR system without having a precoder at the preceding stage of the recording/reproducing system. However, decoding circuits in the apparatuses described in these publications are complicated.

By contrast, the recording/reproducing apparatus 100 in FIG. 1 is of a linear type, where the characteristics of the system do not change even if the order of the individual blocks is changed.

One possible modification is a recording/reproducing apparatus 110 shown in FIG. 3 which has a precoder equivalent circuit 11 located after the comparator 10. The write buffer 4, recording/reproducing system 5 and comparator 10 in FIG. 3 are identical to those in FIG. 1.

The operation of the recording/reproducing apparatus 110 in FIG. 3 will now be discussed referring to the waveform diagram of FIG. 4. The write buffer 4 receives the input signal Din and provides an output signal S4 according to the characteristic of (1−D) to the recording/reproducing system 5. The recording/reproducing system 5 provides its output signal having a characteristic of (1−D)(1+D) to the equalizer 9, which in turn provides an equalization signal S5 to the comparator 10. The comparator 10 performs a comparison operation and provides an output signal S6 to the precoder equivalent circuit 11. The precoder equivalent circuit 11 performs an operation of 1/(1+D) on the output signal S6, thus generating a decoded signal Dout which is substantially the same as the input signal Din.

Even if the input signal Din has been recorded on the recording medium 7 without using a precoder, the signal that is read by the recording/reproducing system 5 can be decoded by the PR system using the PR equalizer 9 and the precoder equivalent circuit 11.

If the operation of the recording/reproducing system 5 or the equalizer 9 in the digital signal recording/reproducing apparatus 110 causes an arbitrary bit b1 in the equalization signal S5 to contain noise n1 which is greater than the threshold value as shown in FIG. 5, however, the comparator 10 performs an operation different from the one illustrated in FIG. 4 so that the bit b1 of the output signal S6 is inverted. Then, the feedback loop of the precoder equivalent circuit 11 inverts all the bits in the decoded signal Dout after the bit b1, causing an error to propagate endlessly. This type of digital signal recording/reproducing apparatus is therefore not practical.

SUMMARY OF THE INVENTION

Accordingly, it is an object of the present invention to provide a digital signal decoding apparatus which performs a decoding operation using a PR system while suppressing propagation of an error without a precoder at the preceding stage of a recording/reproducing system or a transmission system.

In a first aspect of the present invention, a method of decoding a digital signal is provided. First, the digital signal is processed using a delay operation element in accordance with a frequency characteristic of 1+D, where D is an output signal of the delay operation element. The processed digital signal is converted to a conversion signal of at least three values having polarities of 0, positive and negative. A decoded signal is generated by processing the conversion signal in accordance with a frequency characteristic of 1/(1+D). Then, it is detected if there is a conversion error in the conversion signal and a correct signal is generated by restricting propagation of the conversion error to the decoded signal when the conversion error is detected.

In a second aspect of the present invention, a method of decoding a digital signal is provided. First, a 1/(1−D) process is performed on the digital signal using a delay operation element, where D is an output signal of the delay operation element to generate a write signal. The write signal is written on a recording medium in accordance with a (1−D) characteristic. The write signal written on the recording medium is read in accordance with a (1+D) characteristic and PR equalization is performed on the read signal to generate a PR equalization signal. Then, the PR equalization signal is converted to a 3-value signal of 1, 0 and −1 and a decoded signal is generated by processing the 3-value signal in accordance with a frequency characteristic of 1/(1+D). A correct decoded signal is generated by restricting propagation of an error to the decoded signal when the output signal of the delay operation element is 1 or −1 and the digital signal is 0, or when a polarity of the output signal of the delay operation element is opposite to a polarity of the digital signal.

In a third aspect of the present invention, a method of decoding a digital signal is provided. First, a 1/(1−D) process is performed on the digital signal using a delay operation element, where D is an output signal of the delay operation element to generate a transmission signal. The transmission signal is transmitted using a transmission line having a (1−D) characteristic and PR equalization is performed on the transmission signal in accordance with a (1+D) characteristic to generate a PR equalization signal. Then, the PR equalization signal is converted to a 3-value signal of 1, 0 and −1 and a decoded signal is generated by processing the 3-value signal in accordance with a frequency characteristic of 1/(1+D). A correct decoded signal is generated by restricting propagation of an error to the decoded signal when the output signal of the delay operation element is 1 or −1 and the digital signal is 0, or when a polarity of the output signal of the delay operation element is opposite to a polarity of the digital signal.

In a fourth aspect of the present invention, an apparatus for decoding a digital signal processed in accordance with a frequency characteristic of 1+D is provided. D is an output signal of a first delay operation element. The apparatus includes a comparator to convert the digital signal to a conversion signal of at least three values having polarities of 0, positive and negative. An error-propagation restriction circuit is connected to the comparator to generate a decoded signal by processing the conversion signal in accordance with a frequency characteristic of 1/(1+D). The error-propagation restriction circuit detects if there is a conversion error in the conversion signal, restricts propagation of the conversion error to the decoded signal when detecting the conversion error, and generates a correct decoded signal.

In a fifth aspect of the present invention, a digital signal recording/reproducing apparatus is provided. The apparatus includes a write buffer including a first delay operation element to perform a 1/(1−D) process on a digital signal, where D is an output signal of the first delay operation element, and generate a write signal. A recording/reproducing system is connected to the write buffer to write the write signal on a recording medium in accordance with a (1−D) characteristic and read the write signal written on the recording medium in accordance with a (1+D) characteristic. An equalizer is connected to the recording/reproducing system to perform PR equalization on the signal read by the recording/reproducing system and generate a PR equalization signal. A comparator is connected to the equalizer to convert the PR equalization signal to a 3-value signal of 1, 0 and −1. An error-propagation restriction circuit is connected to the comparator and includes a second delay operation element to generate a decoded signal by processing the 3-value signal in accordance with a frequency characteristic of 1/(1+D). The error-propagation restriction circuit generates a correct decoded signal by restricting propagation of an error to the decoded signal when the output signal of the second delay operation element is positive or negative and the digital signal is 0, or when a polarity of the output signal of the second delay operation element is opposite to a polarity of the digital signal.

In a sixth aspect of the present invention, a digital signal transmission apparatus is provided. The apparatus includes a write buffer including a first delay operation element to perform a 1/(1−D) process on a digital signal, where D is an output signal of the first delay operation element, and generate a transmission signal. A transmission line is connected to the write buffer to transmit the transmission signal in accordance with a (1−D) characteristic. An equalizer is connected to the transmission line to perform PR equalization on the transmission signal, transmitted via the transmission line, in accordance with a (1+D) characteristic and generate a PR equalization signal. A comparator is connected to the equalize to convert the PR equalization signal to a 3-value signal of 1, 0 and −1. An error-propagation restriction circuit is connected to the comparator and includes a second delay operation element to generate a decoded signal by processing the 3-value signal in accordance with a frequency characteristic of 1/(1+D). The error-propagation restriction circuit generates a correct decoded signal by restricting propagation of an error to the decoded signal when the output signal of the second delay operation element is positive or negative and the digital signal is 0, or when a polarity of the output signal of the second delay operation element is opposite to a polarity of the digital signal.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 17 is a schematic block diagram of a digital signal transmission apparatus according to a fifth embodiment of the present invention; and FIG. 18 is a schematic block diagram of a digital signal transmission apparatus according to a sixth embodiment of the present invention.

DETAILED DESCRIPTION OF THE PREFERRED EMBODIMENTS

Figure 1:
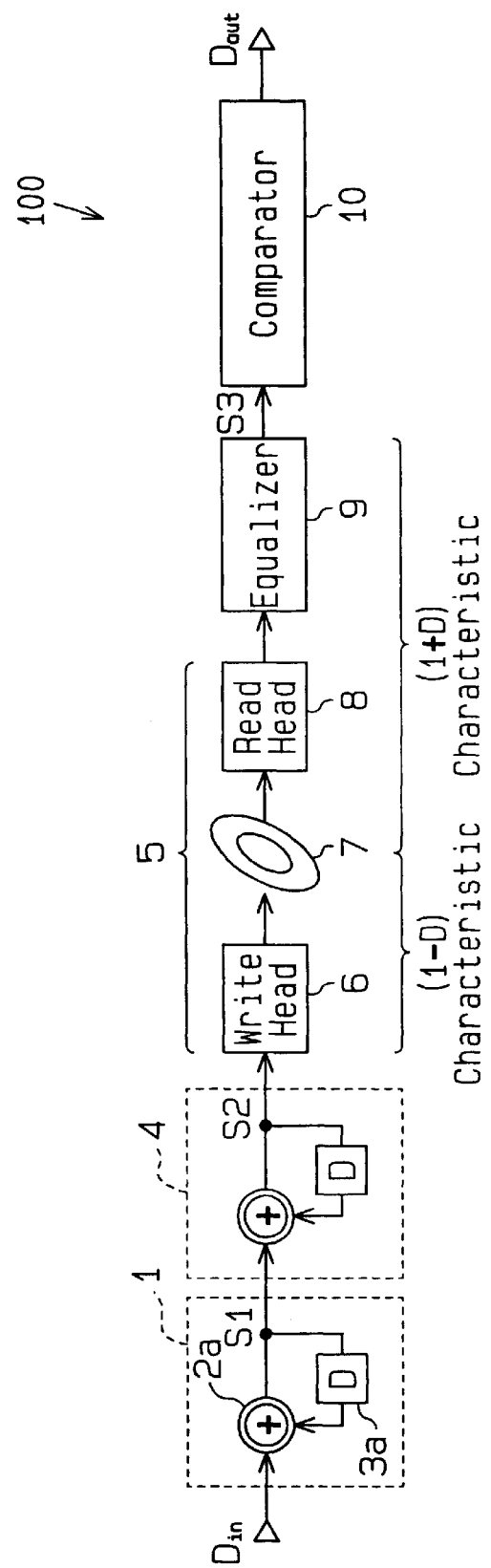
FIG. 1 is a schematic block diagram of a first conventional digital signal recording/reproducing apparatus.
Figure 2:
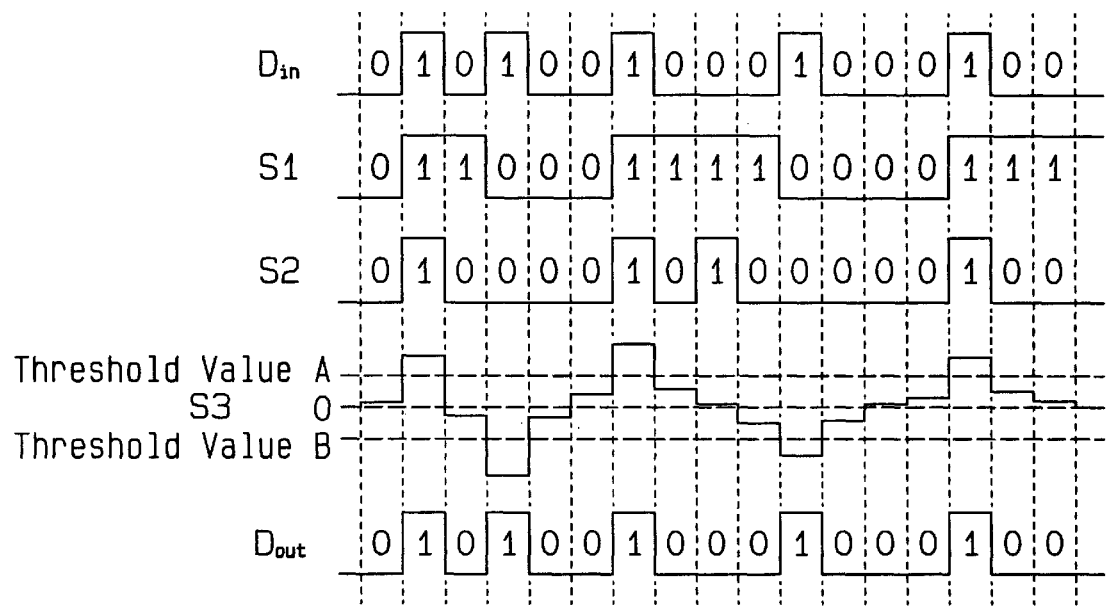
FIG. 2 is a waveform diagram illustrating the operation of the digital signal recording/reproducing apparatus of FIG. 1.

In the drawings, like numerals are used for like elements throughout.

First Embodiment

Figure 3:
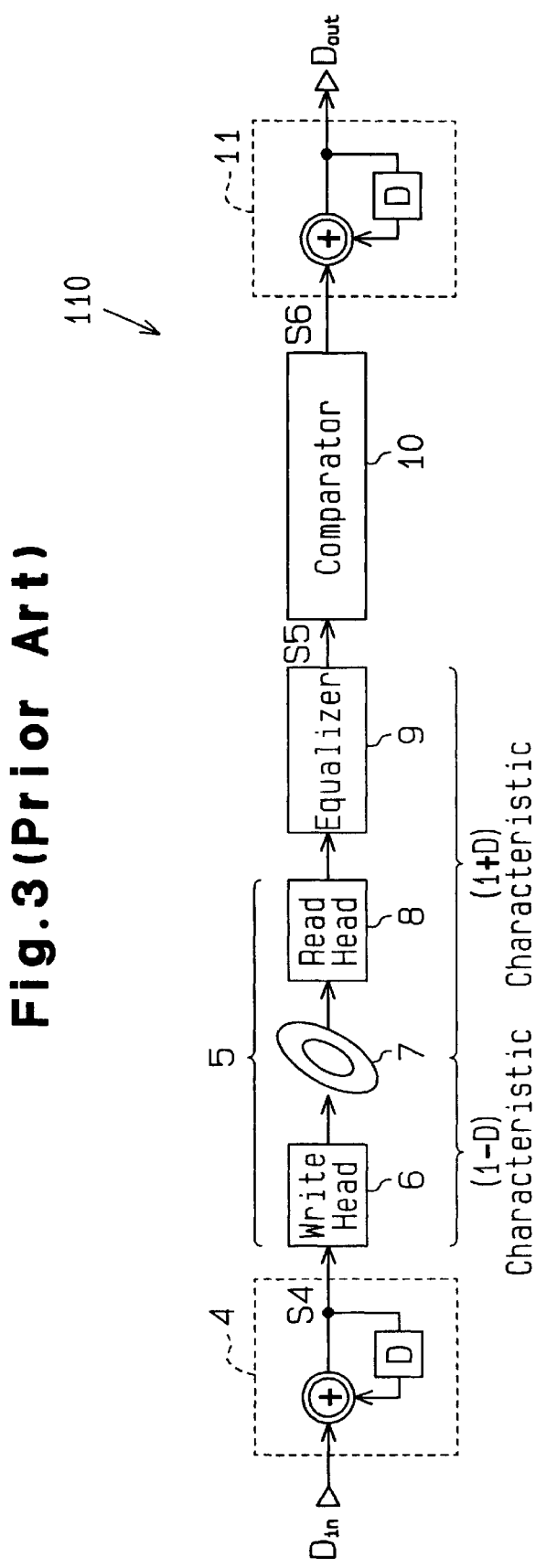
FIG. 3 is a schematic block diagram of a second conventional digital signal recording/reproducing apparatus.
Figure 4:
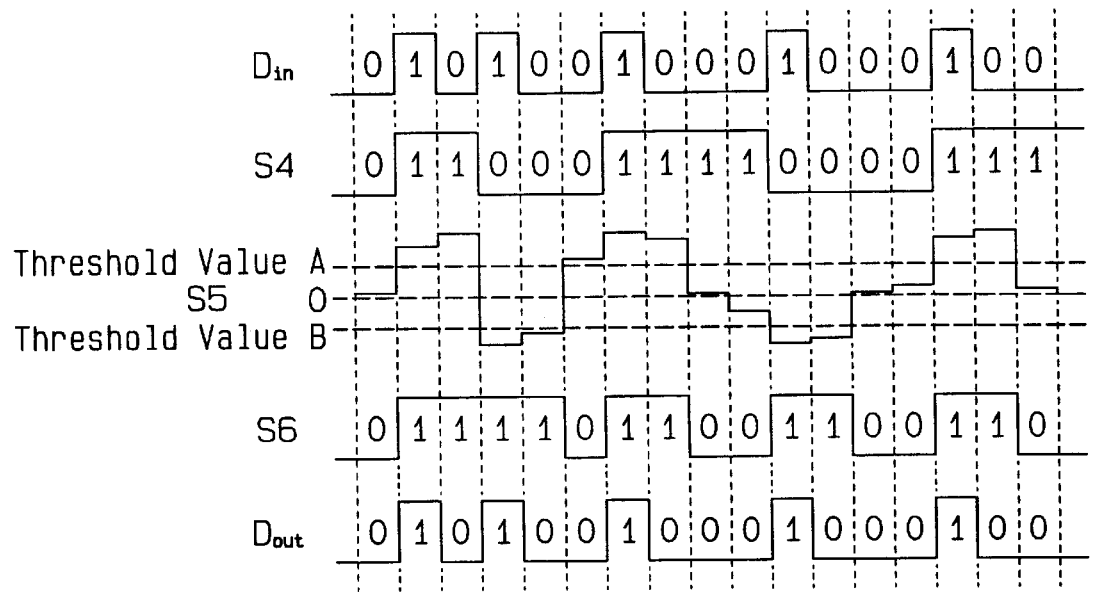
FIG. 4 is a first waveform diagram illustrating the operation of the digital signal recording/reproducing apparatus of FIG. 3.
Figure 6:
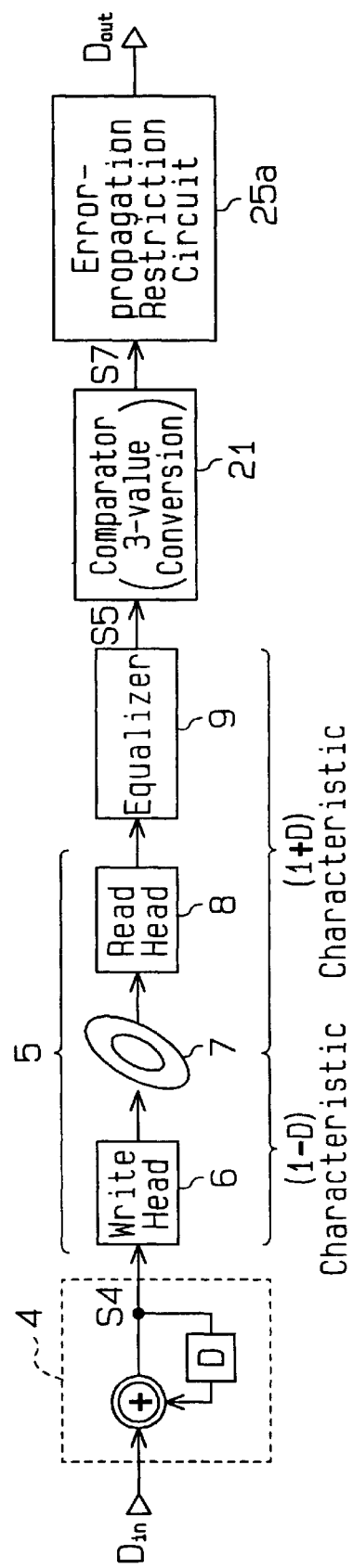
FIG. 6 is a schematic block diagram of a magnetic recording/reproducing apparatus according to a first embodiment of the present invention.

FIG. 6 is a schematic block diagram of a magnetic recording/reproducing apparatus 200 as a digital signal recording/reproducing apparatus according to a first embodiment of the present invention. The structures of a write buffer 4, a recording/reproducing system 5 and an equalizer 9 and the operations of the components from the write buffer 4 to the equalizer 9 are the same as those of the prior art shown in FIGS. 3 and 4.

Figure 7:
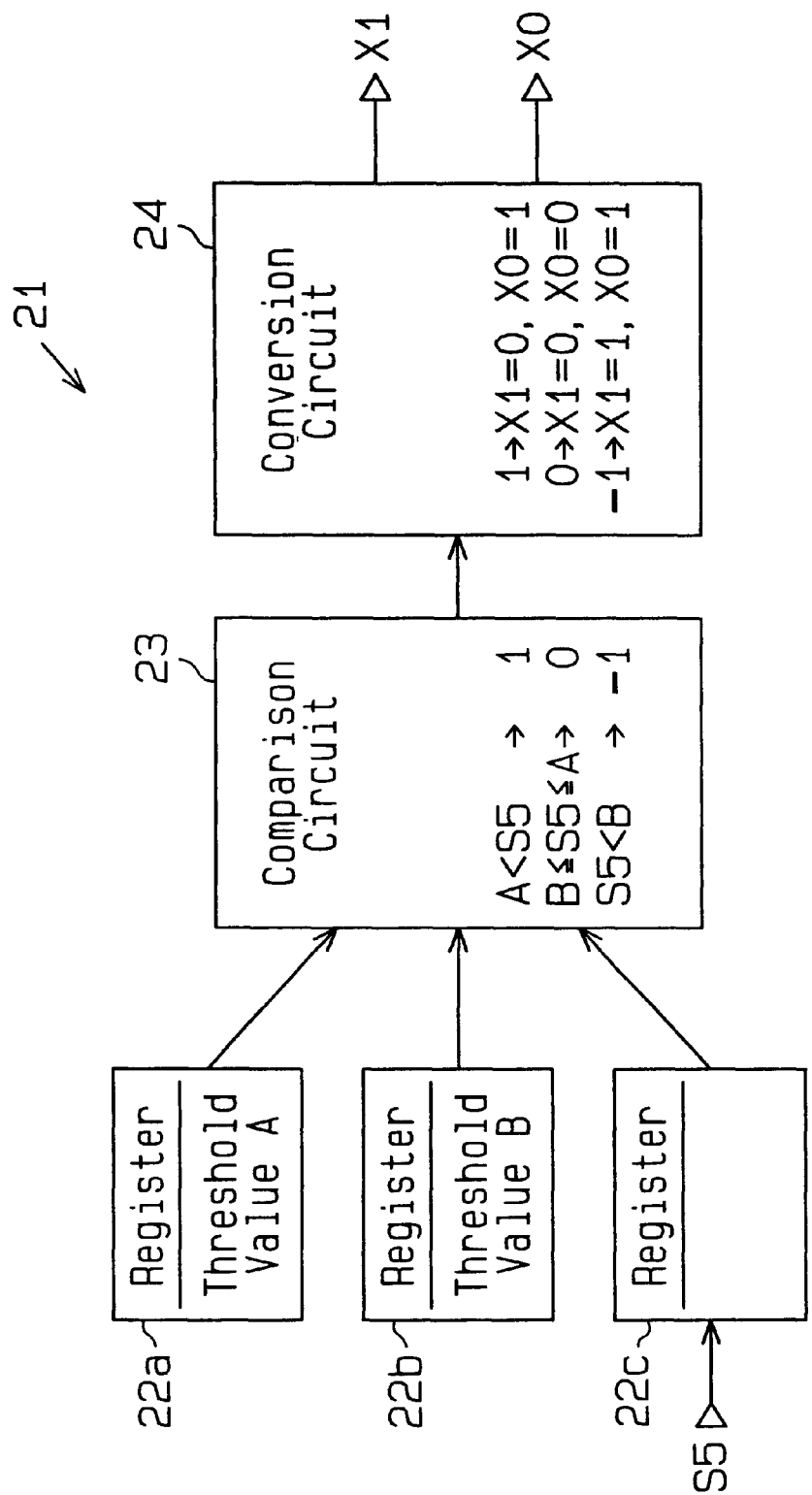
FIG. 7 is a schematic block diagram of a comparator of the magnetic recording/reproducing apparatus of FIG. 6.

A comparator 21 receives an equalization signal S5 from the equalizer 9 and generates a 2-bit output signal X1 and X0. As shown in FIG. 7, the comparator 21 has three registers 22a to 22c, a comparison circuit 23 and a conversion circuit 24.

The first register 22a stores a high-level threshold value A set by an external unit (not shown). The second register 22b stores a low-level threshold value B set by the external unit. The third register 22c holds the equalization signal S5 from the equalizer 9.

The comparison circuit 23 compares the equalization signal S5 from the equalizer 9 stored in the third register 22c with the threshold values A and B and provides one of three values "1", "0" and "-1" to the conversion circuit 24.

Specifically, the comparison circuit 23 outputs "1" when the of the equalization signal S5 is higher than the threshold value A, outputs "-1" when the level of the equalization signal S5 is lower than the threshold value B, and outputs "0" when the level of the equalization signal S5 lies between the threshold values A and B.

The conversion circuit 24 converts the 3-value signal, supplied from the comparison circuit 23, to the 2-bit output signal X1 and X0. The conversion circuit 24 outputs X1=0 and X0=1 when "1" is output from the comparison circuit 23, outputs X1=0 and X0=0 when "0" is output from the comparison circuit 23, and outputs X1=1 and X0=1 when "-1" is output from the comparison circuit 23.

Figures 8, 9:
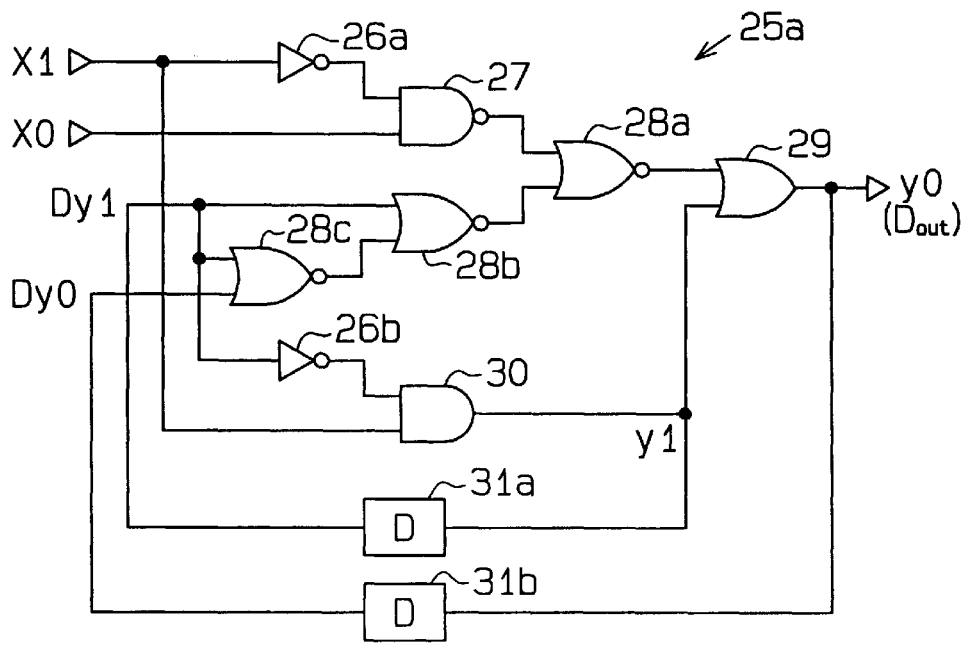
FIG. 8 is a schematic block diagram of an error-propagation restriction circuit of the magnetic recording/reproducing apparatus of FIG. 6.
FIG. 9 is a truth table of the error-propagation restriction circuit of FIG. 8.

FIG. 8 is a schematic block diagram of an error-propagation restriction circuit 25a. The output signal X1 of the comparator 211 is inverted by an inverter circuit 26a and the inverted output signal X1 is supplied to a first input terminal of a NAND gate 27. The output signal X0 of the comparator 21 is supplied to a second input terminal of the NAND gate 27.

The output signal of the NAND gate 27 is supplied to a first input terminal of a NOR gate 28a whose output signal is supplied to a first input terminal of an OR gate 29. The OR gate 29 provides an output signal y0 which is a decoded signal Dout.

The output signal y0 is supplied to a delay operation element 31b whose output signal Dy0 is supplied to a first input terminal of a NOR gate 28c. The output signal of the NOR gate 28c is supplied to a first input terminal of a NOR gate 28b whose output signal is sent to a second input terminal of the NOR gate 28a.

The output signal X1 of the comparator 21 is supplied to a first input terminal of an AND gate 30 whose output signal y1 is supplied to a second input terminal of the OR gate 29 and a delay operation element 31a. The output signal Dy1 of the delayloperation element 31a is supplied to second input terminals of the NOR gates 28b and 28c and an inverter circuit 26b. The output signal of the inverter circuit 26b is supplied to a second input terminal of the AND gate 30.

The logical expression of the error-propagation restriction circuit 25a is given by the following equation 1.

$$y0 = \overline{X1} * X0 * (\overline{Dy1 * Dy0} + Dy1) + X1 * \overline{Dy1}$$

$$y1 = X1 * \overline{Dy1} \tag{1}$$

FIG. 9 depicts the truth table of the error-propagation restriction circuit 25a. The error-propagation restriction circuit 25a prevents the propagation of an error in the output signal y0 caused by noise in the input signals X1 and X0 while carrying out a process of 1/(1+D) equivalent to the operation of a precoder.

Figures 10, 11:
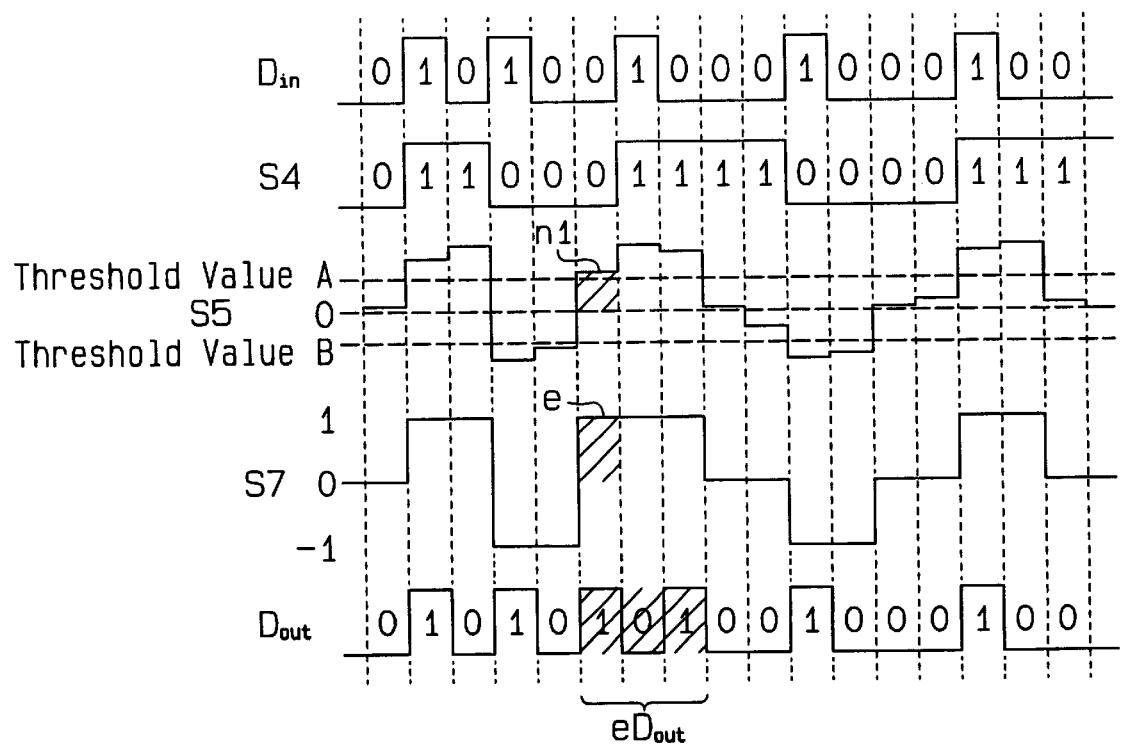
FIG. 10 is an explanatory diagram showing criteria for error determination.
FIG. 11 is a waveform diagram illustrating the operation of the magnetic recording/reproducing apparatus of FIG. 6.

FIG. 10 presents a truth table in a case where the input signals X1 and X2, the output signals y0 and y1 and the output signals Dy0 and Dy1 of the delay operation elements 31b and 31a are respectively expressed by an input signal x, an output signal y and an output signal Dy.

As apparent from this truth table, the error-propagation restriction circuit 25a generates the output signal y that indicates invalidation of the output signal Dy when receiving the input signal x of "0" with the output signal Dy of the delayloperation element being "1" or "-1". That is, the error-propagation restriction circuit 25a generates the output signal y which is acquired by giving a value having the opposite polarity to that of the value of the output signal Dy of the delay operation element to the result of the process of 1/(1+D).

When one of the input signal x and the output signal Dy of the delay operation element is "1" and the other is "−1", the error-propagation restriction circuit 25*a* generates the output signal y that indicates invalidation of the output signal Dy. That is, the error-propagation restriction circuit 25*a* generates the output signal y which is acquired by giving a value having the opposite polarity to that of the value of the output signal Dy of the delay operation element to the result of the process of 1/(1+D).

The operation of the error-propagation restriction circuit 25*a* is based on the following principle. With the output signals X0 and X1 of the comparator 21 regarded as a 3-value signal (1, 0, −1), "1" indicates the position of the inversion of magnetization from, for example, the S polarity to the N polarity on the recording medium 7, "−1" indicates the position of the inversion of magnetization from the N polarity to the S polarity, and "0" indicates a position of other than the inversions of magnetization.

For a magnetic substance, the inversion of magnetization is no more than the transition from "1" to "−1" or from "−1" to "1". If it is detected that "0" follows "1" and "1" follows "0", therefore, it can be considered as an error. Likewise, if it is detected that "0" follows "−1" and "−1" follows "0", it can also be considered as an error.

The error-propagation restriction circuit 25*a* automatically detects such an error and prevents this error from affecting the subsequent bits.

The operation of the magnetic recording/reproducing apparatus 200 will be discussed below with reference to FIG. 11.

Figure 5:
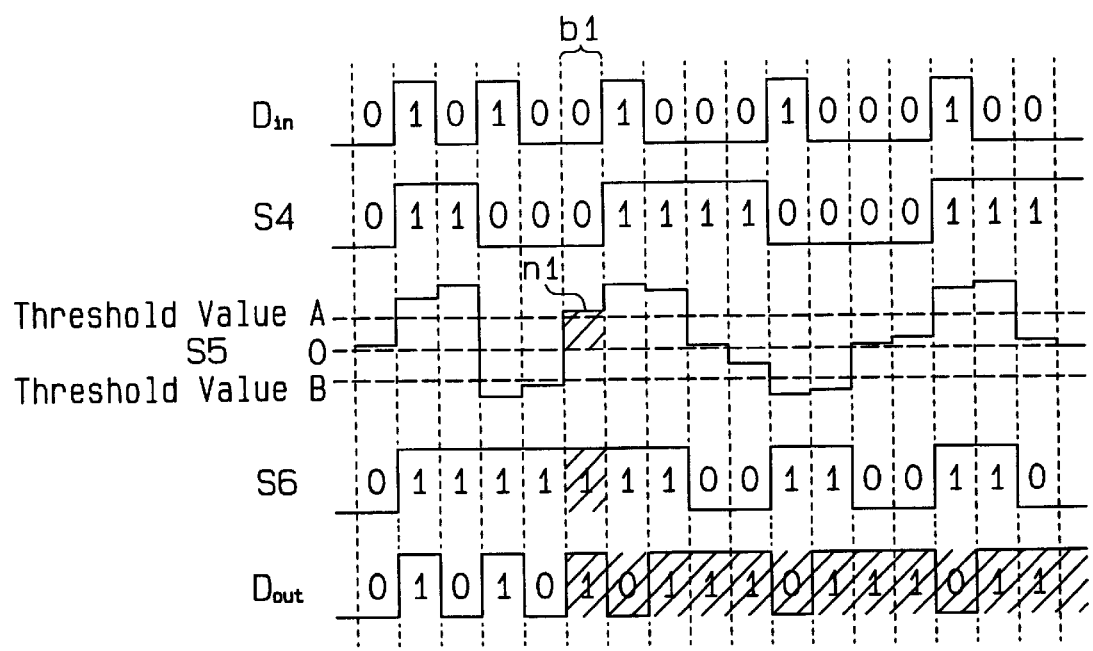
FIG. 5 is a second waveform diagram illustrating the operation of the digital signal recording/reproducing apparatus of FIG. 3.

In FIG. 11, the input signal Din, the output signal S4 of the write buffer 4 and the equalization signal S5 are the same as those of the prior art shown in FIG. 5.

The comparator 21 converts the equalization signal S5 into a 3-value signal and provides an output signal S7 to the error-propagation restriction circuit 25*a*. It is to be noted that while the output signal S7 of the comparator 21 is output as a 2-bit digital signal, it is shown as having three values of "1", "0" and "−1" in FIG. 11 for the sake of convenience.

The error-propagation restriction circuit 25*a* performs the process of 1/(1+D) on the output signal S7 of the comparator 21, thereby generating an output signal Dout identical to the input signal Din. At this time, if noise n1 appears in the equalization signal S5 so that the comparator 21 consecutively outputs three bits of the output signal S7 of "1" containing error data e, the error-propagation restriction circuit 25*a* outputs error data eDout for three bits, but outputs a correct decoded signal Dout for the subsequent bits.

The magnetic recording/reproducing apparatus 200 according to the first embodiment has the following advantages.

(1) As the error-propagation restriction circuit 25*a* equivalent to a precoder and having the characteristic of 1/(1+D) is located at the succeeding stage of the comparator 21, the propagation of an error is suppressed.

(2) Even if the comparator 21 outputs error data e originated from noise produced in the recording/reproducing system 5 and the equalizer 9, the error-propagation restriction circuit 25*a* restricts the output of the error data signal eDout within a predetermined number of bits.

(3) The error-propagation restriction circuit 25*a* can be easily constructed using a relatively small number of gate circuits.

(4) The recording/reproducing operation is carried out using the PR system without providing a precoder at the preceding stage of the recording/reproducing system 5. This makes it possible to accomplish recording/reproduction with an excellent S/N ratio using the PR system while maintaining the compatibility of the recording medium 7.

(5) As the number of bits of the error data signal eDout to be output is limited, the error data signal eDout is easily corrected by an error correcting circuit which is connected to the succeeding stage of the error-propagation restriction circuit 25*a*.

Second Embodiment

Figure 12:
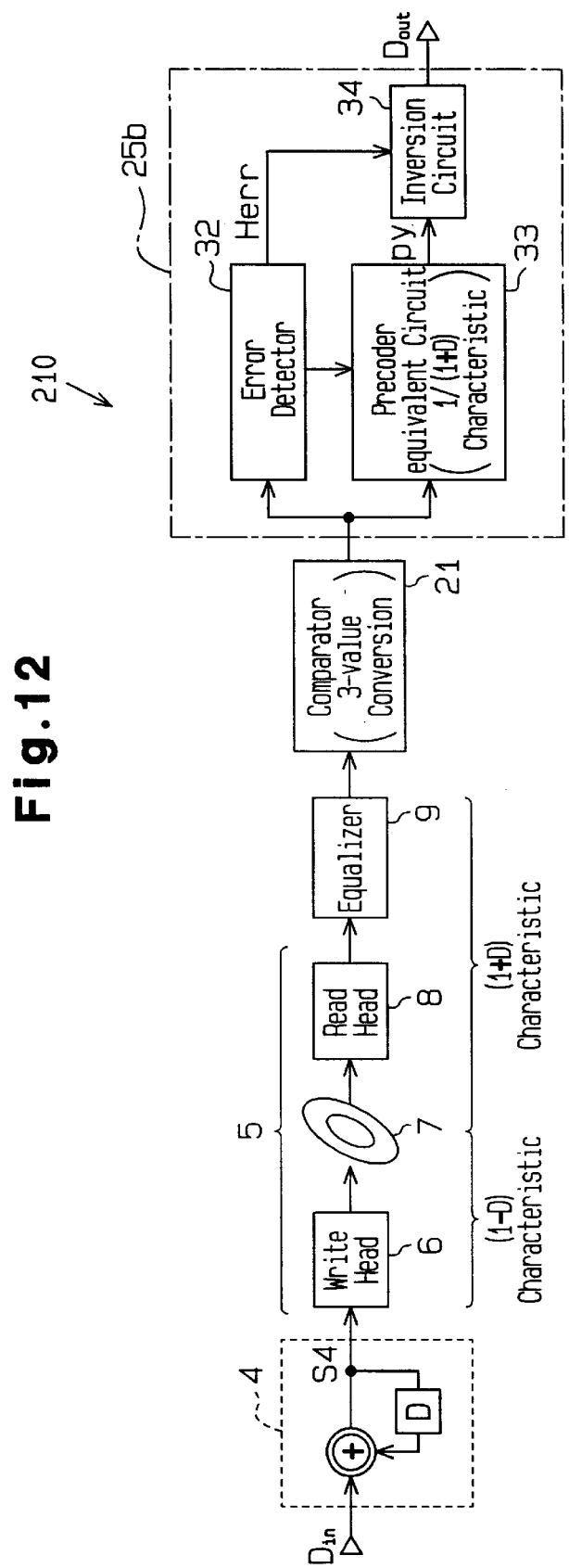
FIG. 12 is a schematic block diagram of a magnetic recording/reproducing apparatus according to a second embodiment of the present invention.
Figure 13:
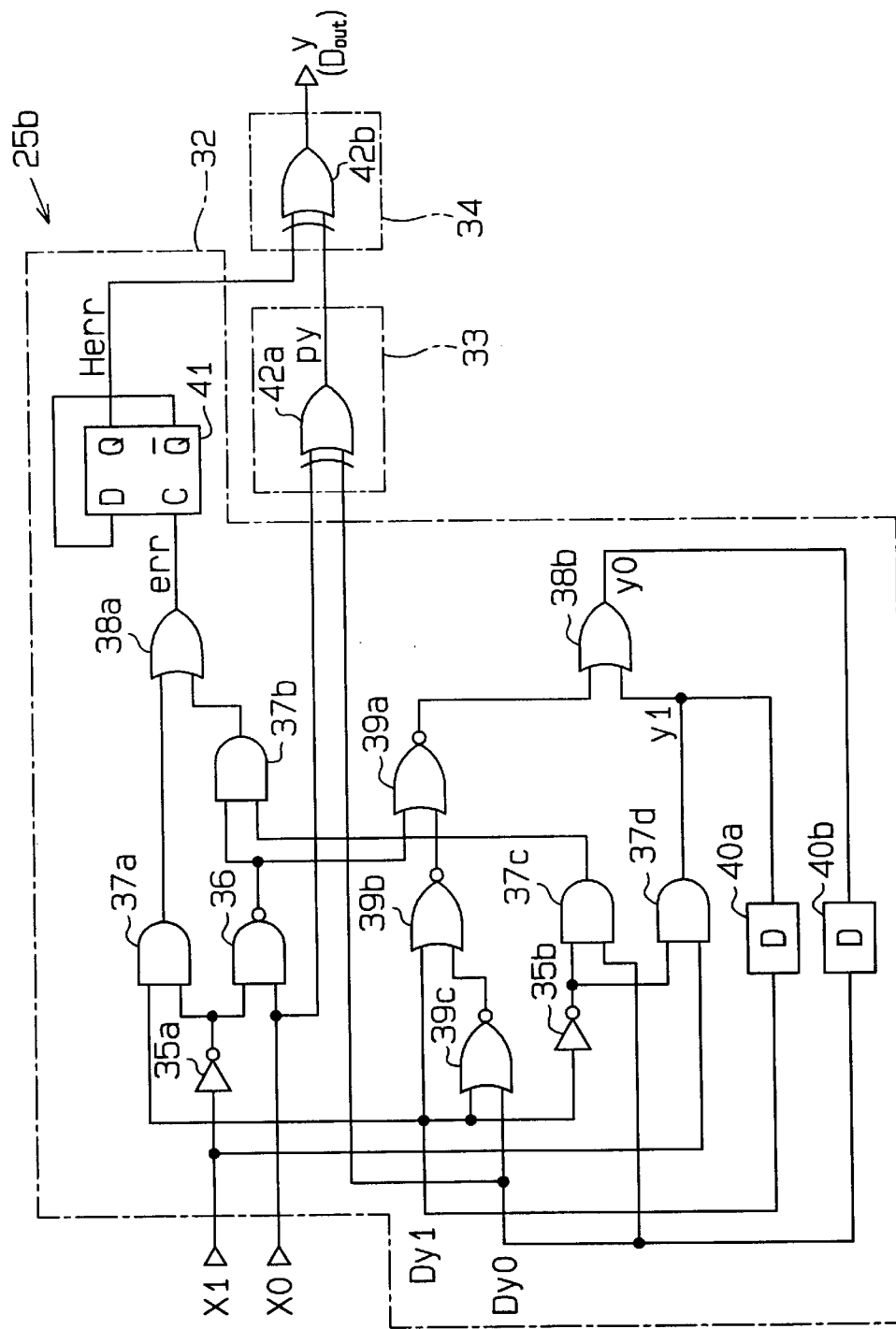
FIG. 13 is a schematic block diagram of an error-propagation restriction circuit of the magnetic recording/reproducing apparatus of FIG. 12.

FIG. 12 is a schematic block diagram of a magnetic recording/reproducing apparatus 210 according to the second embodiment of the present invention. The magnetic recording/reproducing apparatus 210 has an error-propagation restriction circuit 25*b*. The error-propagation restriction circuit 25*b* includes an error detector 32, a precoder equivalent circuit 33 and an inversion circuit 34. FIG. 13 is a schematic block diagram of the error-propagation restriction circuit 25*b*.

The output signal X1 of the comparator 21 is supplied via an inverter circuit 35*a* to first input terminals of an AND gate 37*a* and NAND gate 36. The output signal X0 of the comparator 21 is supplied to a second input terminal of the NAND gate 36 and a first input terminal of an XOR gate 42*a* of the precoder equivalent circuit 33.

The output signal of the AND gate 37*a* is supplied to a first input terminal of an OR gate 38*a* which supplies an error detection signal err as a clock signal C to a clock input terminal of a D type flip-flop circuit (hereinafter referred to as "D-FF") 41.

The D-FF 41 provides a first input terminal of an XOR gate 42*b* of the inversion circuit 34 with an output signal Herr which is inverted every time the error detection signal err rises.

The output signal of the NAND gate 36 is supplied to a first input terminal of an AND gate 37*b* and a first input terminal of a NOR gate 39*a*. The output signal of the AND gate 37*b* is supplied to a second input terminal of the OR gate 38*a*.

The output signal of the NOR gate 39*a* is supplied to a first input terminal of an OR gate 38*b*. The output signal y0 of the OR gate 38*b* is supplied to a delay operation element 40*b* whose output signal Dy0 is supplied to a second input terminal of the XOR gate 42*a*, a first input terminal of a NOR gate 39*c* and a first input terminal of an AND gate 37*c*.

The input signal X1 is input to a first input terminal of an AND gate 37*d* whose output signal y1 is supplied to a second input terminal of the OR gate 38*b* and a delay operation element 40*a*.

The output signal Dy1 of the delay operation element 40*a* is supplied to a second input terminal of the AND gate 37*a*, a second input terminal of the NOR gate 39*b*, a second input terminal of the NOR gate 39*c* and second input terminals of the AND gates 37*c* and 37*d* the last two via an inverter circuit 35*b*. The output signal of the NOR gate 39*c* is input to the second input terminal of the NOR gate 39*b* whose output signal is input to a second input terminal of the NOR gate 39*a*.

The output signal of the AND gate 37*c* is supplied to a second input terminal of the AND gate 37*b*. The output signal of the XOR gate 42*a* is supplied to a second input terminal of the XOR gate 42*b*.

The logical expression of the error detector 32 is given by the following equation 2.

$$err = \overline{X1} * Dy1 + \overline{X1} * \overline{X0} * \overline{Dy1} * Dy0$$

$$y0 = \overline{X1} * X0 * (\overline{Dy1} * Dy0 + Dy1) + X1 * \overline{Dy1}$$

$$y1 = X1 * \overline{Dy1} \qquad (2)$$

The error detector 32, like the error-propagation restriction circuit 25a, operates in accordance with the truth table shown in FIG. 10. Specifically, when the comparator 21 consecutively outputs three bits or more of "1" or "−1", the error detector 32 automatically detects an error at the position of the inversion of magnetization and activates the inversion signal Herr.

The logical expression of the precoder equivalent circuit 33 is given by the following equation 3.

$$py = X0 \oplus Dy0 \qquad (3)$$

(wherein ⊕ indicates a logical symbol of XOR)

The precoder equivalent circuit 33 produces an output signal py by performing an XOR operation on the input signal X0 and the output signal Dy0 of the delay operation element 40b.

The logical expression of the inversion circuit 34 is given by the following equation 4.

$$y = Herr \oplus py \qquad (4)$$

(wherein ⊕ indicates a logical symbol of XOR)

The inversion circuit 34 produces a decoded signal Dout by performing an XOR operation on the inversion signal Herr supplied from the D-FF 41 and the output signal py supplied from the precoder equivalent circuit 33. The inversion circuit 34 outputs the output signal py of the precoder equivalent circuit 33 as the decoded signal Dout when the output signal Herr of the error detector 32 is low, and outputs an inverted signal of the output signal py of the precoder equivalent circuit 33 as the decoded signal Dout when the output signal Herr is high.

Figure 14:
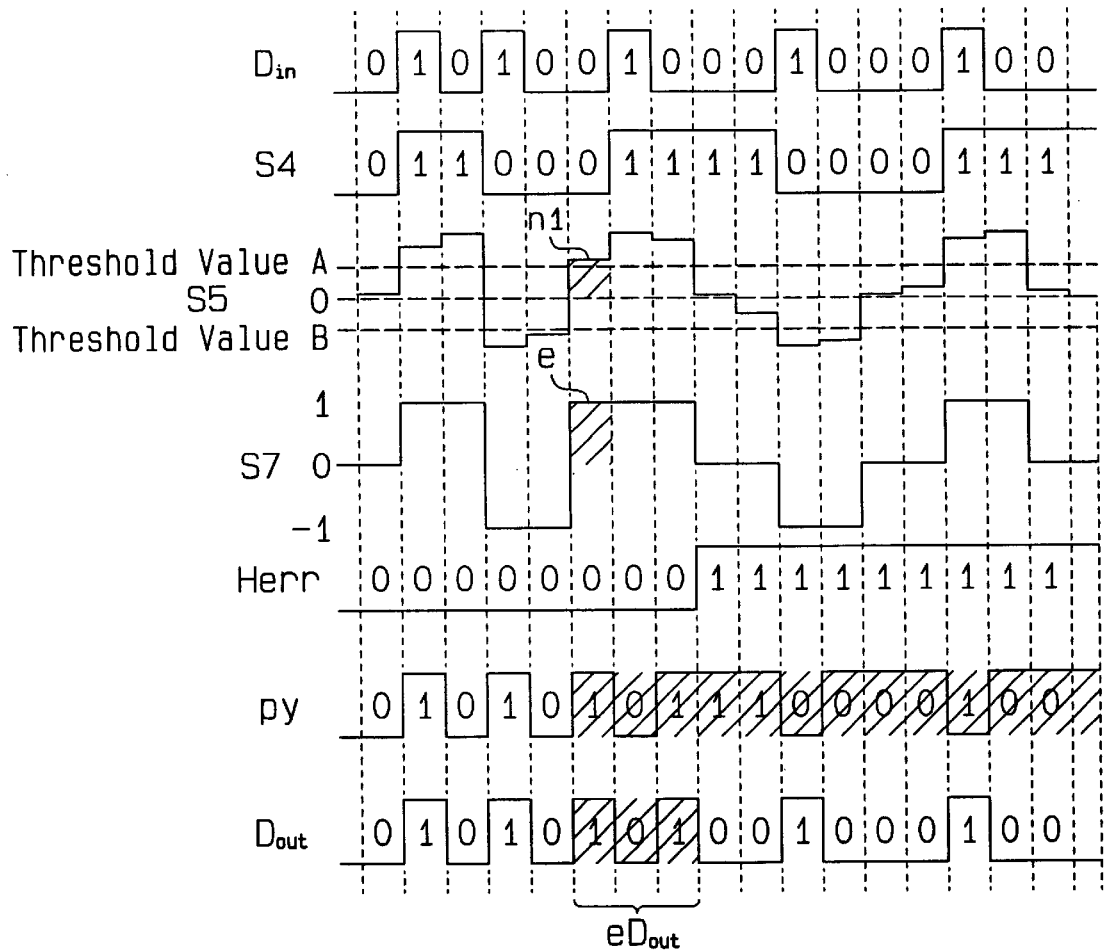
FIG. 14 is a waveform diagram illustrating the operation of the magnetic recording/reproducing apparatus of FIG. 12.

The operation of the magnetic recording/reproducing apparatus 210 will now be discussed with reference to FIG. 14.

The write buffer 4 receives the input signal Din and outputs the output signal S4. The equalizer 9 receives the output signal S5 from the recording/reproducing system 5 and provides the equalization signal S5 to the comparator 21. The comparator 21 supplies the output signal S7 to the error-propagation restriction circuit 25b.

The error detector 32 outputs a low detection signal Herr when the output signal S7 of "1" or "−1" is not output three or more bits in a row from the comparator 21. The precoder equivalent circuit 33 performs the process of 1/(1+D) on the output signal S7 of the comparator 21 and provides its output signal py to the inversion circuit 34. The inversion circuit 34 outputs the output signal py as the decoded signal Dout in response to the low output signal Herr of the error detector 32.

If noise n1 appears in the output signal S5 of the equalizer 9 so that the comparator 21 consecutively outputs three bits of the output signal S7 of "1" containing error data e, the error detector 32 outputs a high detection signal Herr.

Although the precoder equivalent circuit 33 outputs the output signal py containing the error data e, the inversion circuit 34 inverts the output signal py of the precoder equivalent circuit 33 in response to the high detection signal Herr and produces the decoded signal Dout.

Although the error-propagation restriction circuit 25b outputs 3-bit error data eDout containing the error data e from the comparator 21, it outputs a correct decoded signal Dout thereafter.

Third Embodiment

Figure 15:
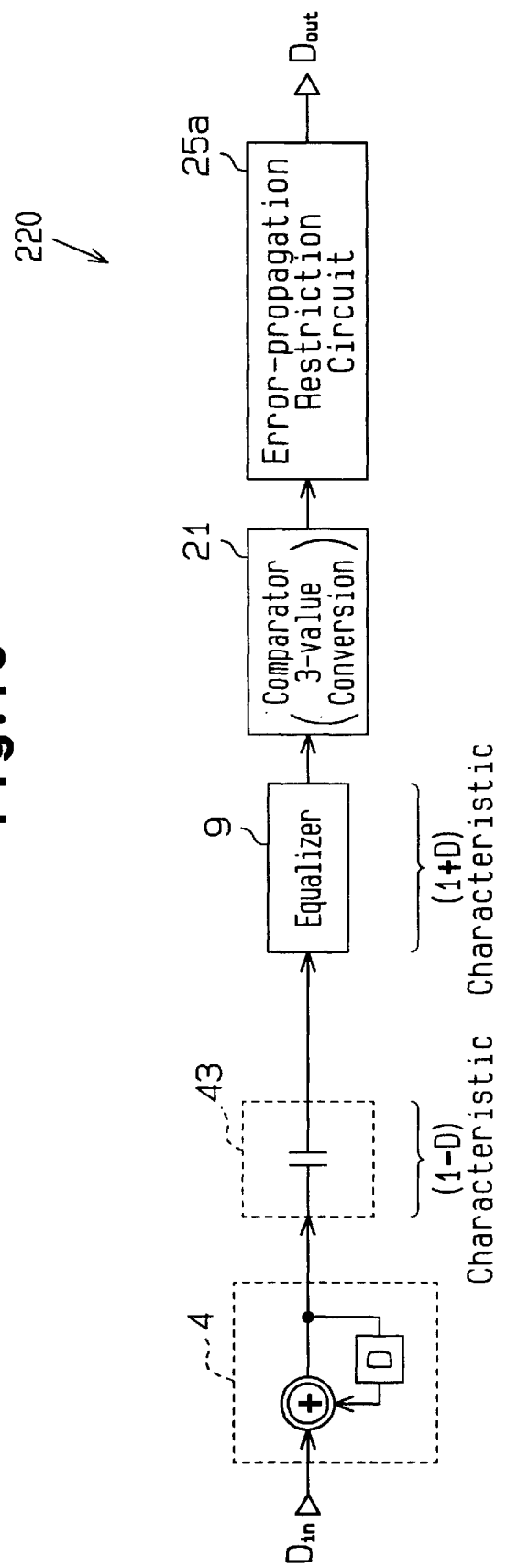
FIG. 15 is a schematic block diagram of a digital signal transmission apparatus according to a third embodiment of the present invention.

FIG. 15 is a schematic block diagram of a digital signal transmission apparatus 220 according to a third embodiment of the present invention. The third embodiment uses the error-propagation restriction circuit 25a of the first embodiment in a transmission line 43 having a capacitive coupling characteristic. The write buffer 4, the equalizer 9 and the comparator 21 are the same as those of the first embodiment.

The input signal Din is provided to the write buffer 4 having the 1/(1−D) characteristic. The write buffer 4 converts the input signal Din into an NRZI code which is in turn provided to the transmission line 43.

The transmission line 43 has a differential characteristic expressed by (1−D). The output signal from the transmission line 43 is supplied to the equalizer 9 having the (1+D) characteristic. The comparator 21 converts the equalization signal from the equalizer 9 into a 3-value signal and provides its output signal to the error-propagation restriction circuit 25a. The error-propagation restriction circuit 25a carries out the same error detection and correction as done in the first embodiment, thereby producing a decoded signal Dout.

The third embodiment can transmit and decode signals via the transmission line 43 having the capacitive coupling characteristic using the PR system.

Fourth Embodiment

Figure 16:
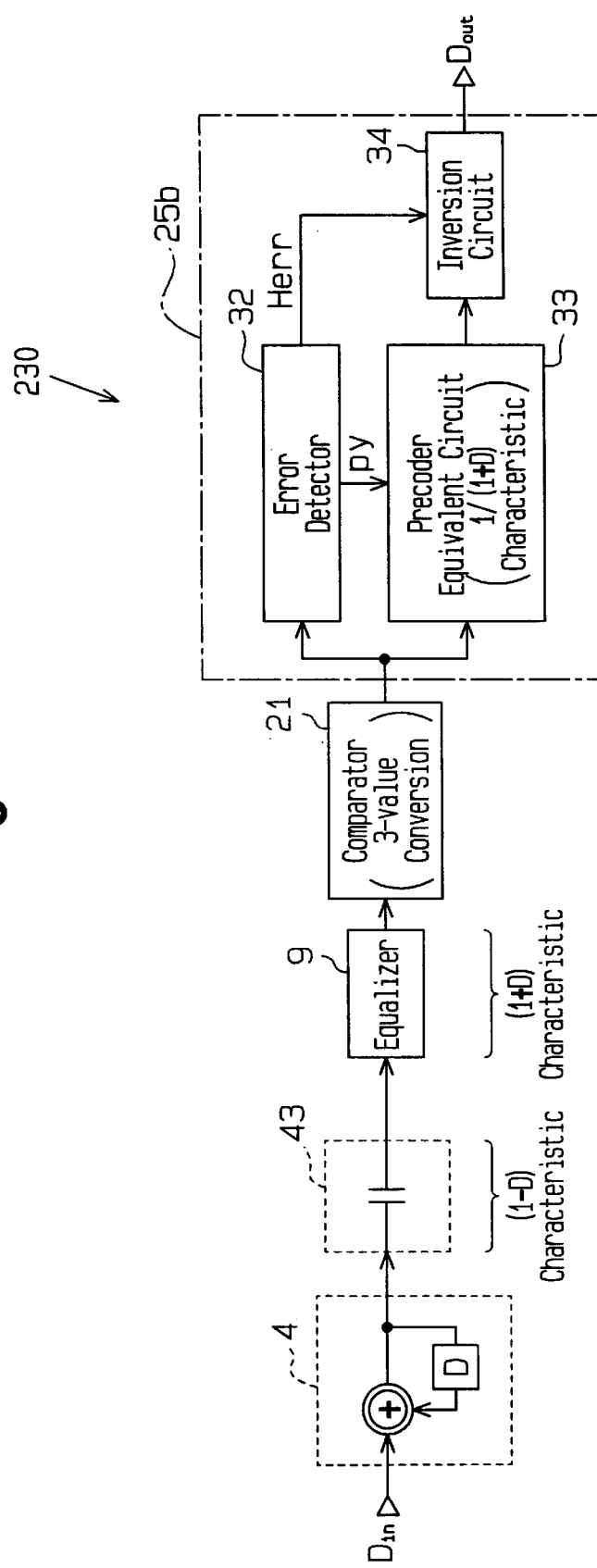
FIG. 16 is a schematic block diagram of a digital signal transmission apparatus according to a fourth embodiment of the present invention.

FIG. 16 is a schematic block diagram of a digital signal transmission apparatus 230 according to a fourth embodiment of the present invention. The fourth embodiment uses the error-propagation restriction circuit 25b of the second embodiment in the transmission line 43. The write buffer 4, the equalizer 9 and the comparator 21 are the same as those of the second embodiment.

The error-propagation restriction circuit 25b carries out the same error detection and correction as done in the second embodiment, thereby producing a decoded signal Dout. The fourth embodiment can transmit and decode signals via the transmission line 43 having the capacitive coupling characteristic using the PR system.

Fifth Embodiment

FIG. 17 is a schematic block diagram of a digital signal transmission apparatus 240 according to a fifth embodiment of the present invention. The fifth embodiment uses the error-propagation restriction circuit 25a of the first embodiment in a transmission line 44 having a transformer coupling characteristic. The write buffer 4, the equalizer 9 and the comparator 21 are the same as those of the first embodiment.

The input signal Din is input to the write buffer 4 having the 1/(1−D) characteristic. The write buffer 4 converts the input signal Din into an NRZI code which is in turn provided to the transmission line 44.

The transmission line 44 has a differential characteristic expressed by (1−D). The output signal from the transmission line 44 is supplied to the equalizer 9 having the (1+D) characteristic. The comparator 21 converts the equalization signal from the equalizer 9 into a 3-value signal and provides its output signal to the error-propagation restriction circuit 25a. The error-propagation restriction circuit 25a carries out the same error detection and correction as done in the first embodiment, thereby producing a decoded signal Dout.

The fifth embodiment can transmit and decode signals via the transmission line 44 having the transformer coupling characteristic using the PR system.

Sixth Embodiment

FIG. 18 is a schematic block diagram of a digital signal transmission apparatus 250 according to a sixth embodiment of the present invention. The sixth embodiment uses the error-propagation restriction circuit 25b of the second embodiment in the transmission line 44. The write buffer 4, the equalizer 9 and the comparator 21 are the same as those of the second embodiment.

The error-propagation restriction circuit 25b carries out the same error detection and correction as done in the second embodiment, thereby producing a decoded signal Dout. The sixth embodiment can transmit and decode signals via the transmission line 44 having the transformer coupling characteristic using the PR system.

It should be apparent to those skilled in the art that the present invention may be embodied in many other specific forms without departing from the spirit or scope of the invention. Therefore, the present examples and embodiments are to be considered as illustrative and not restrictive and the invention is not to be limited to the details given herein, but may be modified within the scope and equivalence of the appended claims.

What is claimed is:

1. A method of decoding a digital signal, comprising the steps of:
   processing the digital signal using a delay operation element in accordance with a frequency characteristic of 1+D, where D is an output signal of the delay operation element;
   converting the processed digital signal to a conversion signal of at least three values having polarities of 0, positive and negative;
   generating a decoded signal by processing the conversion signal in accordance with a frequency characteristic of 1/(1+D);
   detecting if there is a conversion error in the conversion signal; and
   generating a correct signal by restricting propagation of the conversion error to the decoded signal when the conversion error is detected.

2. The method according to claim 1, wherein the correct signal is generated when the output signal of the delay operation element is positive or negative and the digital signal is 0, or when a polarity of the output signal of the delay operation element is opposite to a polarity of the digital signal.

3. The method according to claim 1, wherein when the output signal of the delay operation element is positive or negative and the digital signal is 0, or when a polarity of the output signal of the delay operation element is opposite to a polarity of the digital signal, the restricting propagation step includes generating the correct decoded signal by giving a polarity opposite to that of the output signal of the delay operation element to a result of the 1/(1+D) process.

4. The method according to claim 1, wherein when the output signal of the delay operation element is positive or negative and the digital signal is 0, or when a polarity of the output signal of the delay operation element is opposite to a polarity of the digital signal, the propagation step includes generating the correct decoded signal by inverting a polarity of a result of the 1/(1+D) process.

5. The method according to claim 1, wherein the restricting propagation step includes generating the correct decoded signal by neglecting the output signal of the delay operation element.

6. A method of decoding a digital signal, comprising the steps performing a 1/(1−D) process on the digital signal using a delay operation element, where D is an output signal of the delay operation element to generate a write signal;
   writing the write signal on a recording medium in accordance with a (1−D) characteristic;
   reading the write signal written on the recording medium in accordance with a (1+D) characteristic and performing PR equalization on the read signal to generate a PR equalization signal;
   converting the PR equalization signal to a 3-value signal of 1, 0 and −1;
   generating a decoded signal by processing the 3-value signal in accordance with a frequency characteristic of 1/(1+D); and
   generating a correct decoded signal by restricting propagation of an error to the decoded signal when said output signal of said delay operation element is 1 or −1 and the digital signal is 0, or when a polarity of said output signal of said delay operation element is opposite to a polarity of the digital signal.

7. The method according to claim 6, wherein the error-propagation restriction step includes generating the correct decoded signal by neglecting said output signal of said delay operation element.

8. The method according to claim 6, wherein the error-propagation restriction step includes generating the correct decoded signal by giving a polarity opposite to that of said output signal of said delay operation element to a result of the 1/(1+D) process.

9. The method according to claim 6, wherein the error-propagation restriction step includes generating the correct decoded signal by inverting, a polarity of a result of the 1/(1+D) process.

10. A method of decoding a digital signal, comprising the steps of:
    performing a 1/(1−D) process on the digital signal using a delay operation element, where D is an output signal of the delay operation element to generate a transmission signal;
    transmitting the transmission signal using a transmission line having a (1−D) characteristic;
    performing PR equalization on the transmission signal in accordance with a (1+D) characteristic to generate a PR equalization signal;
    converting the PR equalization signal to a 3-value signal of 1, 0 and −1;
    generating a decoded signal by processing the 3-value signal in accordance with a frequency characteristic of 1/(1+D); and
    generating a correct decoded signal by restricting propagation of an error to the decoded signal when said output signal of said delay operation element is 1 or −1 and the digital signal is 0, or when a polarity of said output signal of said delay operation element is opposite to a polarity of the digital signal.

11. The method according to claim 10, wherein the error-propagation restriction step includes generating the correct decoded signal by neglecting said output signal of said delay operation element.

12. The method according to claim 10, wherein the error-propagation restriction step includes generating the correct decoded signal by giving a polarity opposite to that of said output signal of said delay operation element to a result of the 1/(1+D) process.

13. The method according to claim 10, wherein the error-propagation restriction step includes generating the correct decoded signal by inverting a polarity of a result of the 1/(1+D) process.

14. An apparatus for decoding a digital signal processed in accordance with a frequency characteristic of 1+D, where D is an output signal of a first delay operation element, comprising:

a comparator for converting the digital signal to a conversion signal of at least three values having polarities of 0, positive and negative; and an error-propagation restriction circuit, connected to the comparator, for generating a decoded signal by processing the conversion signal in accordance with a frequency characteristic of 1/(1+D), the error-propagation restriction circuit detecting if there is a conversion error in the conversion signal, restricting propagation of the conversion error to the decoded signal when detecting the conversion error, and generating a correct decoded signal.

15. The apparatus according to claim 14, wherein the error-propagation restriction circuit when the output signal of the first delay operation element is positive or negative and the digital signal is 0, or when a polarity of the output signal of the first delay operation element is opposite to a polarity of the digital signal.

16. The apparatus according to claim 14, wherein the error-propagation restriction circuit includes a second delay operation element, wherein when an output signal of the second delay operation element is positive or negative and the digital signal is 0, or when a polarity of the output signal of the second delay operation element is opposite to a polarity of the digital signal, the error-propagation restriction circuit generates the correct decoded signal by giving a polarity opposite to that of the output signal of the second delay operation element to a result of the 1/(1+D)-process.

17. The apparatus according to claim 14, wherein the error-propagation restriction circuit includes a second delay operation element, wherein when an output signal of the second delay operation element is positive or negative and the digital signal is 0, or when a polarity of the output signal of the second delay operation element is opposite to a polarity of the digital signal, the error-propagation restriction circuit generates the correct decoded signal by inverting a polarity of a result of the 1/(1+D) process.

18. The apparatus according to claim 14, wherein the error-propagation restriction circuit generates the correct decoded signal by neglecting the output signal of the first delay operation element.

19. A digital signal recording/reproducing apparatus comprising:

a write buffer including a first delay operation element, for performing a 1/(1−D) process on a digital signal, where D is an output signal of the first delay operation element, and generating a write signal;

a recording/reproducing system, connected to the write buffer, for writing the write signal on a recording medium in accordance with a (1−D) characteristic and reading the write signal written on the recording medium in accordance with a (1+D) characteristic;

an equalizer, connected to the recording/reproducing system, for performing PR equalization on the signal read by the recording/reproducing system and generating a PR equalization signal;

a comparator, connected to the equalizer, for converting the PR equalization signal to a 3-value signal of 1, 0 and −1; and an error-propagation restriction circuit, connected to the comparator and including a second delay operation element, for generating a decoded signal by processing the 3-value signal in accordance with a frequency characteristic of 1/(1+D), the error-propagation restriction circuit generating a correct decoded signal by restricting propagation of an error to the decoded signal when the output signal of the second delay operation element is positive or negative and the digital signal is 0, or when a polarity of the output signal of the second delay operation element is opposite to a polarity of the digital signal.

20. The apparatus according to claim 19, wherein the error-propagation restriction circuit generates the correct decoded signal by neglecting the output signal of the second delay operation element.

21. The apparatus according to claim 19, wherein the error-propagation restriction circuit generates the correct decoded signal by giving a polarity opposite to that of the output signal of the second delay operation element to a result of the 1/(1+D) process.

22. The apparatus according to claim 19, wherein the error-propagation restriction circuit generates the correct decoded signal by inverting a polarity of a result of the 1/(1+D) process.

23. The apparatus according to claim 19, wherein the error-propagation restriction circuit includes:

an error detector for detecting if there is a conversion error in the 3-value signal;

a precoder for generating the decoded signal by processing the 3-value signal in accordance with the frequency characteristic of 1/(1+D); and an inversion circuit, connected to the error detector and the precoder, for inverting a polarity of a result of the 1/(1 4−D) process based on a result of detection of the conversion error and generating the correct decoded signal.

24. A digital signal transmission apparatus comprising:

a write buffer including a first delay operation element, for performing a 1/(1−D) process on a digital signal, where D is an output signal of the first delay operation element, and generating a transmission signal;

a transmission line, connected to the write buffer, for transmitting the transmission signal in accordance with a (1−D) characteristic;

an equalizer, connected to the transmission line, for performing PR equalization on the transmission signal, transmitted via the transmission line, in accordance with a (1+D) characteristic and generating a PR equalization signal;

a comparator, connected to the equalizer, for converting the PR equalization signal to a 3-value signal of 1, 0 and −1; and an error-propagation restriction circuit, connected to the comparator and including a second delay operation element, for generating a decoded signal by processing the 3-value signal in accordance with a frequency characteristic of 1/(1+D), the error-propagation restriction circuit generating a correct decoded signal by restricting propagation of an error to the decoded signal when the output signal of the second delay operation element is positive or negative and the digital signal is 0, or when a polarity of the output signal of the second delay operation element is opposite to a polarity of the digital signal.

25. The apparatus according to claim 24, wherein the error-propagation restriction circuit generates the correct decoded signal by neglecting the output signal of the second delay operation element.

26. The apparatus according to claim 24, wherein the error-propagation restriction circuit generates the correct decoded signal by giving a polarity opposite to that of the output signal of the second delay operation element to a result of the 1/(1+D) process.

27. The apparatus according to claim 24, wherein the error-propagation restriction circuit generates the correct decoded signal by inverting a polarity of a result of the 1/(1+D) process.

28. The apparatus according to claim 24, wherein the error-propagation restriction circuit includes:

an error detector for detecting if there is a conversion error in the 3-value signal;

a precoder for generating the decoded signal by processing the 3-value signal in accordance with the frequency characteristic of 1/(1+D); and an inversion circuit, connected to the error detector and the precoder, for inverting a polarity of a result of the 1/(1+D) process based, on a result of detection of the conversion error and generating the correct decoded signal.

29. The apparatus according to claim 24, wherein the transmission line has a capacitive coupling characteristic.

30. The apparatus according to claim 24, wherein the transmission line has a transformer coupling characteristic.

* * * * *